(12) United States Patent
Knisley et al.

(10) Patent No.: US 11,866,824 B2
(45) Date of Patent: Jan. 9, 2024

(54) HOMOLEPTIC LANTHANIDE DEPOSITION PRECURSORS

(71) Applicant: Applied Materials, Inc., Santa Clara, CA (US)

(72) Inventors: Thomas Knisley, Livonia, MI (US); Mark Saly, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/941,123

(22) Filed: Sep. 9, 2022

(65) Prior Publication Data

US 2023/0027560 A1 Jan. 26, 2023

Related U.S. Application Data

(62) Division of application No. 16/752,618, filed on Jan. 25, 2020, now Pat. No. 11,473,198.

(Continued)

(51) Int. Cl.

| | | |
|---|---|---|
| *C07F 5/00* | (2006.01) | |
| *C09D 1/00* | (2006.01) | |
| *C23C 16/455* | (2006.01) | |
| *C23C 16/18* | (2006.01) | |
| *C23C 16/32* | (2006.01) | |

(Continued)

(52) U.S. Cl.
CPC ........ *C23C 16/45553* (2013.01); *C07F 5/003* (2013.01); *C08F 4/545* (2013.01); *C09D 1/00* (2013.01); *C23C 16/18* (2013.01); *C23C 16/308* (2013.01); *C23C 16/32* (2013.01); *C23C 16/34* (2013.01); *C23C 16/36* (2013.01); *C23C 16/38* (2013.01); *C23C 16/40* (2013.01); *C23C 16/42* (2013.01); *C23C 16/4408* (2013.01); *C08F 136/02* (2013.01)

(58) Field of Classification Search
CPC .................................. C07F 5/003; C09D 1/00
See application file for complete search history.

(56) References Cited

U.S. PATENT DOCUMENTS

| | | | |
|---|---|---|---|
| 5,874,131 A | | 2/1999 | Vaartstra et al. |
| 6,020,511 A | * | 2/2000 | Vaartstra ........... H01L 21/28556 |
| | | | 556/176 |

(Continued)

FOREIGN PATENT DOCUMENTS

WO 2015136365 A1 9/2015

OTHER PUBLICATIONS

Anwander, Reiner, et al., "Volatile Donor-Functionalized Alkoxy Derivatives of Lutetium and Their Structural Characterization", Inorg. Chem. 1997, 36, pp. 3545-3552.

(Continued)

*Primary Examiner* — Catherine S Branch
(74) *Attorney, Agent, or Firm* — Servilla Whitney LLC

(57) ABSTRACT

Described are lanthanide-containing metal coordination complexes which may be used as precursors in thin film depositions, e.g., atomic layer deposition processes. More specifically, described are homoleptic lanthanide-amino-alkoxide metal coordination complexes, lanthanide-carbohydrazide metal coordination complexes, and lanthanide-diazadiene metal coordination complexes. Additionally, methods for depositing lanthanide-containing films through an atomic layer deposition process are described.

18 Claims, 5 Drawing Sheets

Related U.S. Application Data

(60) Provisional application No. 62/796,787, filed on Jan. 25, 2019.

(51) Int. Cl.
*C23C 16/44* (2006.01)
*C23C 16/38* (2006.01)
*C23C 16/30* (2006.01)
*C23C 16/40* (2006.01)
*C23C 16/34* (2006.01)
*C23C 16/42* (2006.01)
*C23C 16/36* (2006.01)
*C08F 4/54* (2006.01)
*C08F 136/02* (2006.01)

(56) References Cited

U.S. PATENT DOCUMENTS

| | | |
|---|---|---|
| 8,962,876 B2 | 2/2015 | Winter et al. |
| 9,255,327 B2 | 2/2016 | Winter et al. |
| 10,106,893 B1 | 10/2018 | Knisley |
| 2009/0302434 A1 | 12/2009 | Pallem et al. |
| 2015/0118100 A1 | 4/2015 | Anthis et al. |
| 2017/0022609 A1 | 1/2017 | Knisley et al. |
| 2017/0358444 A1 | 12/2017 | Thompson et al. |
| 2018/0037540 A1 | 2/2018 | Yoshino et al. |
| 2018/0291051 A1 | 10/2018 | Anthis et al. |
| 2018/0291052 A1 | 10/2018 | Anthis et al. |

OTHER PUBLICATIONS

Cloke, F. Geoffrey N., et al., "Homoleptic Diazadiene Complexes of Titanium, Yttrium, and Some Lanthanoid Elements", J. Chem. Soc., Chem. Commun., 1986, pp. 1344-1345.

Karunarathne, Mahesh C., et al., "Exceptional thermal stability and high volatility in mid to late first row transition metal complexes containing carbohydrazide ligands", Polyhedron 52 (2013), pp. 820-830.

Knisley, Thomas J., et al., "Volatility and High Thermal Stability in Mid to Late First Row Transition Metal Diazadienyl Complexes", Organometallics 2011, 30, pp. 5010-5017.

\* cited by examiner

HOMOLEPTIC LANTHANIDE DEPOSITION PRECURSORS

CROSS-REFERENCE TO RELATED APPLICATIONS

This application is a Divisional Application of U.S. application Ser. No. 16/752,618, filed Jan. 25, 2020, which claims priority to U.S. Provisional Application No. 62/796,787, filed Jan. 25, 2019, the entire disclosures of which are hereby incorporated by reference herein.

TECHNICAL FIELD

Embodiments of the disclosure generally relate to deposition precursors and methods for depositing thin films using said precursors. More particularly, provided are homoleptic lanthanide precursor compounds and methods for producing lanthanide containing films.

BACKGROUND

The semiconductor industry faces many challenges in the pursuit of device miniaturization, which involves rapid scaling of nanoscale features. Challenges include the introduction of complex fabrication steps such as multiple lithography exposures and the integration of high performance materials. To produce nanoscale features for next-generation semiconductor devices, an available selection of materials having different etch selectivities need to be available so that precise patterns and dimensions can be created.

When there is an array of different materials that are exposed during a single etch step, one material may be etched faster than the others. Materials of high interest in the semiconductor industry are those that attain high etch resistance towards common etch processes. Such materials include yttrium and lanthanide-containing materials due to their inherent chemical stability towards exposure of halide-based etchants. Additionally, when these films are coated on semiconductor equipment (etchers, ALD/CVD reactors, implanters, etc.), they can increase the lifetime of the tool, increase tool availability, and decrease the risk for metal contamination from chamber corrosion.

There are very few processes available that demonstrate deposition of yttrium and lanthanide-containing materials. There are a limited number of viable chemical precursors available that have the requisite properties of robust thermal stability, high reactivity, and vapor pressure suitable for film growth to occur. In addition, precursors that may meet these requirements suffer from poor long-term stability and lead to thin films that contain elevated concentrations of contaminants such as carbon and/or halides, which are deleterious to the target film application. Therefore, there is a need for new precursors containing yttrium and lanthanides.

SUMMARY

One or more embodiments of the disclosure are directed to a metal coordination complex having a formula I: $Ln_xL_y$ (I), wherein Ln is a lanthanide having an oxidation state of +3; x is 1 or 2; y is an integer from 1 to 4; L is selected from $NR'CH_2CR_2O$, $NR'N=CRO$, or $NR=CHCH=NR$; and R, R' are independently selected from hydrogen, branched or unbranched $C_{1-12}$ alkyl, substituted or unsubstituted $C_{1-12}$ aryl, branched or unbranched $C_{1-6}$ alkenyl, branched or unbranched $C_{1-6}$ alkynyl, acyl, alkyamido, hydrazido, silyl, aldehyde, or keto groups.

Additional embodiments of the disclosure are directed to methods of depositing a film. The method comprises: exposing a substrate to a lanthanide-containing precursor to form a lanthanide species on the substrate, wherein the lanthanide-containing precursor comprises a metal coordination complex of formula I $Ln_xL_y$ (I), wherein Ln is a lanthanide having an oxidation state of +3 and is selected from the group consisting of Y, Sc, La, Ce, Pr, Nd, Pm, Sm, Eu, Gd, Tb, Dy, Ho, Er, Tm, Yb, and Lu; x is 1 or 2; y is an integer from 1 to 4; L is selected from $NR'CH_2CR_2O$, $NR'N=CRO$, or $NR=CHCH=NR$; and R, R' are independently selected from hydrogen, branched or unbranched $C_1$-12 alkyl, substituted or unsubstituted $C_{1-12}$ aryl, branched or unbranched $C_{1-6}$ alkenyl, branched or unbranched $C_{1-6}$ alkynyl, acyl, alkyamido, hydrazido, silyl, aldehyde, or keto groups; and exposing the substrate to a reactant to react with the lanthanide species on the substrate to form a lanthanide film.

Further embodiments of the disclosure are directed to a method of depositing a film, the method comprising: positioning a substrate in a processing chamber; exposing at least a portion of a substrate surface to a lanthanide-containing precursor comprising a metal coordination complex of formula I $Ln_xL_y$ (I), wherein Ln is a lanthanide having an oxidation state of +3 and is selected from the group consisting of Y, Sc, La, Ce, Pr, Nd, Pm, Sm, Eu, Gd, Tb, Dy, Ho, Er, Tm, Yb, and Lu; x is 1 or 2; y is an integer from 1 to 4; L is selected from $NR'CH_2CR_2O$, $NR'N=CRO$, or $NR=CHCH=NR$; and R, R' are independently selected from hydrogen, branched or unbranched $C_{1-12}$ alkyl, substituted or unsubstituted $C_{1-12}$ aryl, branched or unbranched $C_{1-6}$ alkenyl, branched or unbranched $C_{1-6}$ alkynyl, acyl, alkyamido, hydrazido, silyl, aldehyde, or keto groups; purging the processing chamber of the lanthanide-containing precursor; exposing at least a portion of the substrate surface to a reactant; and purging the processing chamber of the reactant to deposit a lanthanide-containing film on the substrate surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
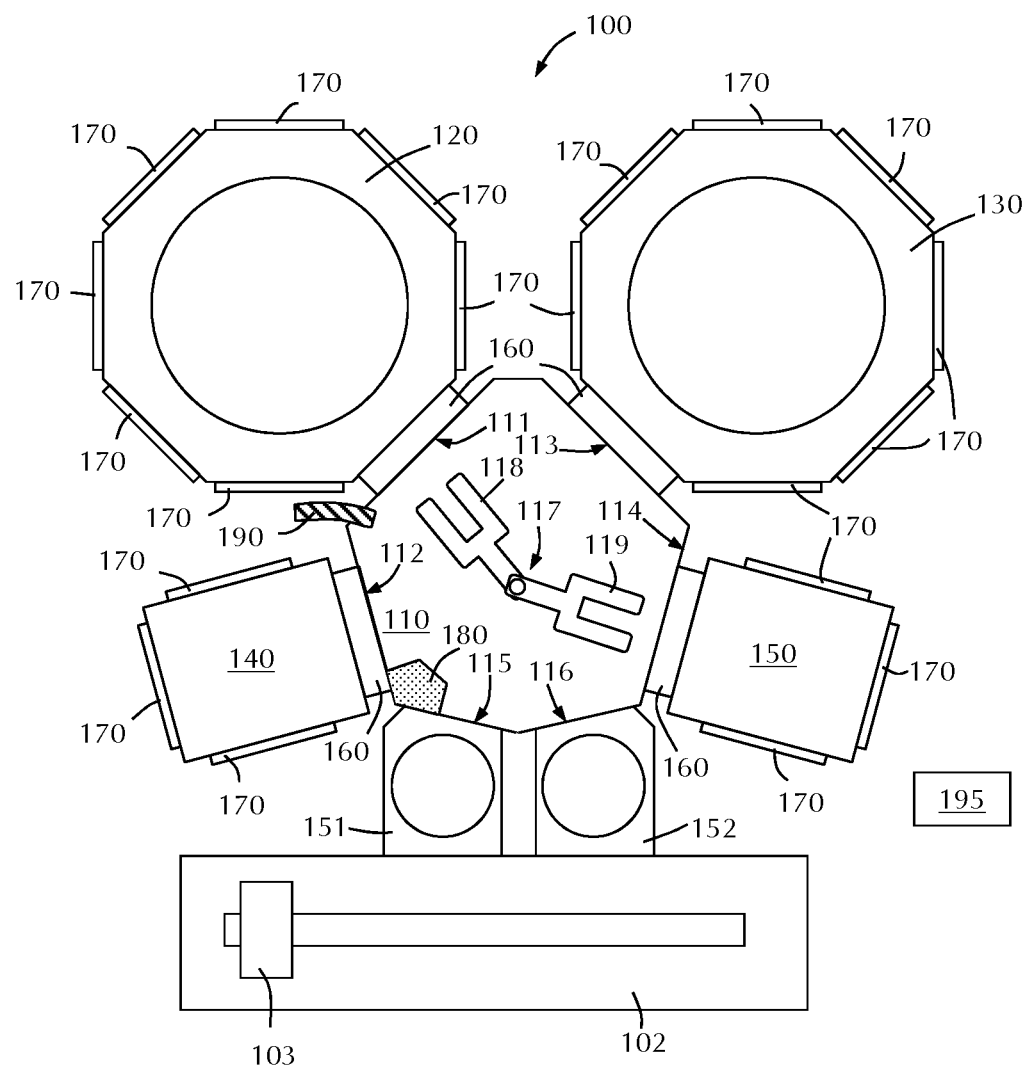
FIG. 1 shows a schematic view of a processing platform in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

In a time-domain ALD process, exposure to each reactive compound is separated by a time delay to allow each compound to adhere and/or react on the substrate surface and then be purged from the processing chamber. The reactive gases are prevented from mixing by the purging of the processing chamber between subsequent exposures.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the processing gases. During substrate movement, different portions of the substrate surface, or material on the substrate surface, are exposed to the two or more reactive compounds so that any given point on the substrate is substantially not exposed to more than one reactive compound simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In one aspect of a time-domain ALD process, a first reactive gas (i.e., a first precursor or compound A) is pulsed into the reaction zone followed by a first time delay. A second precursor or compound B is pulsed into the reaction zone followed by a second delay. During each time delay, a purge gas, such as argon, is introduced into the processing chamber to purge the reaction zone or otherwise remove any residual reactive compound or reaction products or by-products from the reaction zone. Alternatively, the purge gas may flow continuously throughout the deposition process so that only the purge gas flows during the time delay between pulses of reactive compounds. The reactive compounds are alternatively pulsed until a predetermined film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In one aspect of a spatial ALD process, a first reactive gas and second reactive gas (e.g., hydrogen radicals) are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to the first reactive gas and the second reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

One or more embodiments of the disclosure advantageously provide a new class of precursors containing aminoalkoxide, carbohydrazide, and diazadienyl ligand sets. The precursors of one or more embodiments advantageously possess long-term stability. The precursors of some embodiments advantageously lead to films that have low levels on contaminants.

In one or more embodiments, the class of precursors are metal coordination complexes having a formula (I):

Wherein Ln is a lanthanide having an oxidation state of +3; x is 1 or 2; y is an integer from 1 to 4; L is selected from NR'CH$_2$CR$_2$O, NR'N=CRO, or NR=CHCH=NR; and R, R' are independently selected from hydrogen, branched or unbranched C$_{1-12}$ alkyl, substituted or unsubstituted C$_{1-12}$ aryl, branched or unbranched C$_{1-6}$ alkenyl, branched or unbranched C$_{1-6}$ alkynyl, acyl, alkyamido, hydrazido, silyl, aldehyde, or keto groups.

As used herein, the term "lanthanide" or "Ln" refers to a series of fifteen metallic chemical elements with atomic numbers 57 through 71 and, additionally, yttrium and scandium. More specifically, as used herein, the term "lanthanide" or "Ln" includes the chemical elements yttrium (Y), scandium (Sc), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thullium (Tm), ytterbium (Yb), and lutetium (Lu). The chemistry of the lanthanides is dominated by the +3 oxidation state. All of the lanthanide elements exhibit the oxidation state +3, and some of the lanthanide elements exhibit other oxidation states included +2 and +4. In one or more embodiments, the lanthanides describe herein have an oxidation state of +3.

In one or more embodiments, Ln is selected from the group consisting of Y, Sc, La, Ce, Pr, Nd, Pm, Sm, Eu, Gd, Tb, Dy, Ho, Er, Tm, Yb, and Lu. In more specific embodiments, Ln is selected from the group consisting of Y or La.

The metal coordination complex of one or more embodiments is homoleptic. As used herein, the term "homoleptic" refers to a chemical compound, more particularly, a metal coordination complex, in which the ligands coordinated to the metal are all identical.

In one or more embodiments, there may be more than one lanthanide metal present, such that, in Formula (I) Ln$_x$L$_y$ (I), x is 2. In said embodiments, the metal coordination complex is a dimer. In other embodiments, the metal coordination complex comprises two different metals selected from the group consisting of Y, Sc, La, Ce, Pr, Nd, Pm, Sm, Eu, Gd, Tb, Dy, Ho, Er, Tm, Yb, and Lu.

In one or more embodiments, there is a single lanthanide metal present, such that, in Formula (I) Ln$_x$L$_y$ (I), x is 1.

In one or more embodiments, there is more than one ligand, L present in the metal coordination complex. In Formula (I) Ln$_x$L$_y$ (I), y is an integer from 1 to 4. Thus, in some embodiments, there is one ligand, L, present. In another embodiment, there are two ligands present. In further embodiments, there are three ligands present. In still further embodiments, there are four ligands present.

In one or more specific embodiments, there is a single lanthanide metal present and there are three ligands present, such that, in Formula (I) Ln$_x$L$_y$ (I), x is 1 and y is 3.

The metal coordination complex of one or more embodiments has a lanthanide aminoalkoxide structure of Formula II:

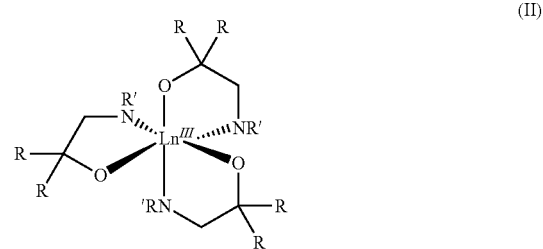

wherein Ln is selected from the group consisting of Y, Sc, La, Ce, Pr, Nd, Pm, Sm, Eu, Gd, Tb, Dy, Ho, Er, Tm, Yb, and Lu, and R, R' are independently selected from hydrogen, branched or unbranched C$_{1-12}$ alkyl, substituted or unsubstituted C$_{1-12}$ aryl, branched or unbranched C$_{1-6}$ alkenyl, branched or unbranched C$_{1-6}$ alkynyl, acyl, alkyamido, hydrazido, silyl, aldehyde, or keto groups.

In specific embodiments, the lanthanide, Ln, comprises Y, Sc, or La.

In one or more embodiments, the metal coordination complex has a lanthanide carbohydrazide structure of Formula (III):

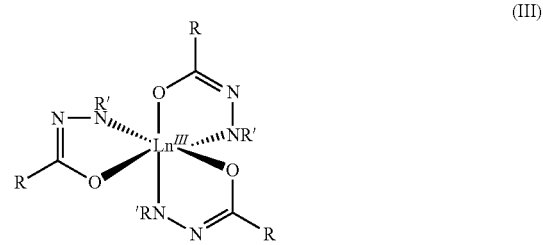

wherein Ln is selected from the group consisting of Y, Sc, La, Ce, Pr, Nd, Pm, Sm, Eu, Gd, Tb, Dy, Ho, Er, Tm, Yb, and Lu, and R, R' are independently selected from hydrogen, branched or unbranched C$_{1-12}$ alkyl, substituted or unsubstituted C$_{1-12}$ aryl, branched or unbranched C$_{1-6}$ alkenyl, branched or unbranched C$_{1-6}$ alkynyl, acyl, alkyamido, hydrazido, silyl, aldehyde, or keto groups.

In specific embodiments, the lanthanide, Ln, comprises Y, Sc, or La.

In further embodiments, the metal coordination complex has a lanthanide diazadiene structure of Formula (IV):

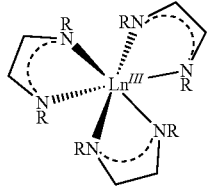

(IV)

wherein Ln is selected from the group consisting of Y, Sc, La, Ce, Pr, Nd, Pm, Sm, Eu, Gd, Tb, Dy, Ho, Er, Tm, Yb, and Lu, and R, R' are independently selected from hydrogen, branched or unbranched $C_{1-12}$ alkyl, substituted or unsubstituted $C_{1-12}$ aryl, branched or unbranched $C_{1-6}$ alkenyl, branched or unbranched $C_{1-6}$ alkynyl, acyl, alkyamido, hydrazido, silyl, aldehyde, or keto groups.

In specific embodiments, the lanthanide, Ln, comprises Y, Sc, or La.

It will be recognized by one of skill in the art that the absolute stereochemistry of the metal coordination complexes in one of or more embodiments may be different than that depicted.

In one or more embodiments, the diazadiene ligands in Formula (IV) can adopt several resonance forms when binding to a lanthanide as depicted in scheme (I).

Scheme (I)

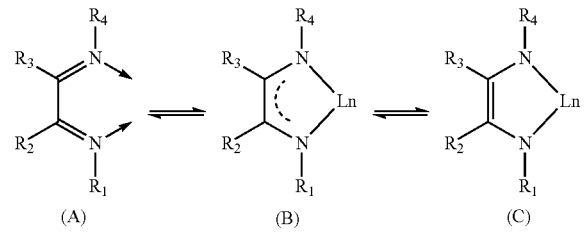

Each of these resonance forms imparts a different electronic charge on the lanthanide metal center when bonded together in a metal complex. Resonance form (A) containing two double bonds (the diene) is a neutral, nonionic ligand (DAD0). Resonance form (B) of scheme (I) contains a radical resonance structure and is a monoanionic ligand (DAD1). Resonance form (C) of scheme (I) containing a single double bond is a dianionic ligand (DAD2). For each of these resonance forms, $R_1$ and $R_4$ are independently selected from the group consisting of hydrogen, branched or unbranched $C_{1-12}$ alkyl, substituted or unsubstituted $C_{1-12}$ aryl, branched or unbranched $C_{1-6}$ alkenyl, branched or unbranched $C_{1-6}$ alkynyl, acyl, alkyamido, hydrazido, silyl, aldehyde, or keto groups, and each of $R_2$ and $R_3$ are independently selected from H.

Some embodiments of the disclosure advantageously provide methods for forming lanthanide-containing films with high etch selectivity and low levels of contaminants. Some embodiments of the disclosure advantageously provide methods for depositing lanthanide-containing films on a substrate surface. In specific embodiments, the lanthanide, Ln, comprises Y, Sc, or La.

In one or more embodiments, a lanthanide-containing film is formed by exposing a substrate to a lanthanide-containing precursor to form a lanthanide species on the substrate, and exposing the substrate to a reactant to react with the lanthanide species on the substrate to form a lanthanide film. In one or more embodiments, a lanthanide-containing film is formed by exposing a substrate to a lanthanide-containing precursor to form a lanthanide species on the substrate wherein the lanthanide-containing precursor comprises a metal coordination complex of formula I $Ln_xL_y$ (I) wherein Ln is a lanthanide having an oxidation state of +3, x is 1 or 2, y is an integer from 1 to 4, L is selected from NR'CH$_2$CRRO, NR'NCRO, or NR=CHCH=NR, and R, R' are independently selected from hydrogen, branched or unbranched $C_{1-12}$ alkyl, substituted or unsubstituted $C_{1-12}$ aryl, branched or unbranched $C_{1-6}$ alkenyl, branched or unbranched $C_{1-6}$ alkynyl, acyl, alkyamido, hydrazido, silyl, aldehyde, or keto groups; and exposing the substrate to a reactant to react with the lanthanide species on the substrate to form a lanthanide film. In one or more embodiments, the Ln is selected from the group consisting of Y, Sc, La, Ce, Pr, Nd, Pm, Sm, Eu, Gd, Tb, Dy, Ho, Er, Tm, Yb, and Lu. In other embodiments, the Ln is a lanthanide having an oxidation state of +3 and is selected from the group consisting of Y, Sc, La, Ce, Pr, Nd, Pm, Sm, Eu, Gd, Tb, Dy, Ho, Er, Tm, Yb, and Lu.

Some embodiments of the processing method provide that the metal coordination complex has a structure of Formula (II), Formula (III), or Formula (IV):

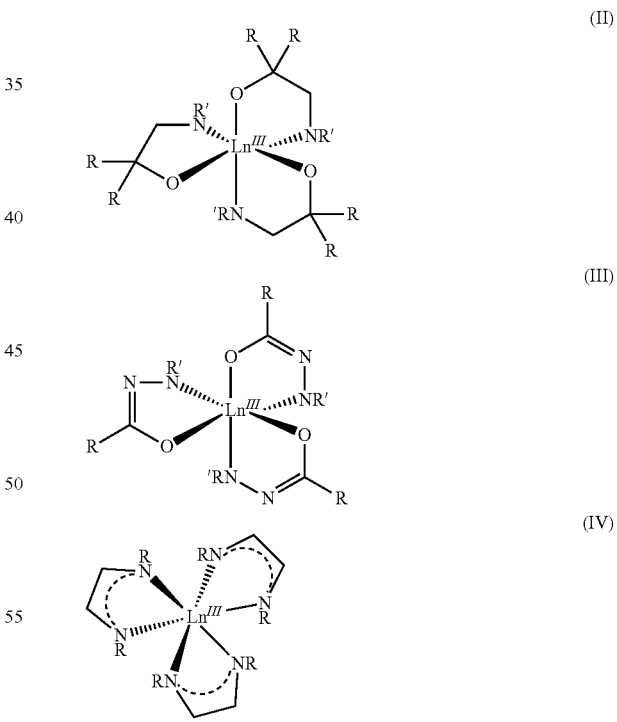

wherein Ln is a lanthanide having an oxidation state of +3, x is 1 or 2, y is an integer from 1 to 4, L is selected from NR'CH$_2$CRRO, NR'NCRO, or NR=CHCH=NR, and R, R' are independently selected from hydrogen, branched or unbranched $C_{1-12}$ alkyl, substituted or unsubstituted $C_{1-12}$ aryl, branched or unbranched $C_{1-6}$ alkenyl, branched or unbranched $C_{1-6}$ alkynyl, acyl, alkyamido, hydrazido, silyl, aldehyde, or keto groups. In one or more embodiments, the Ln is selected from the group consisting of Y, Sc, La, Ce, Pr, Nd, Pm, Sm, Eu, Gd, Tb, Dy, Ho, Er, Tm, Yb, and Lu. In other embodiments, the Ln is a lanthanide having an oxidation state of +3 and is selected from the group consisting of Y, Sc, La, Ce, Pr, Nd, Pm, Sm, Eu, Gd, Tb, Dy, Ho, Er, Tm, Yb, and Lu.

In one or more embodiments, the substrate is exposed to a reactant to react with the lanthanide species on the substrate to form a lanthanide film. The reactant of one or more embodiments comprises one or more of $O_2$, $O_3$, $H_2O_2$, water, $NH_3$, hydrazine, hydrazine derivatives, $NO_2$, $N_2O$, silane, disilane, aminosilane, silylene, carbene, alkene, alkyne, boron, combinations thereof, or plasmas thereof.

In some embodiments, the lanthanide-containing precursor and the reactant are exposed to the substrate surface sequentially. In other embodiments, the lanthanide-containing precursor and the reactant are exposed to the substrate surface simultaneously.

In some embodiments, the processing method further comprises exposing the substrate to a metal-containing precursor to form a ternary material comprising Ln and one or more metal M selected from Sc, Ti, Lu, Co, Al, In, Y, La, Ac, Zr, Hf, V, Nb, Ta, Cr, Mo, W, Mn, Re, Tc, Fe, Ru, Os, Rh, Ir, Ni, Pd, Pt, Cu, Ag, Au, Zn, Cd, or Sn.

As used herein, the term "ternary material" refers to a compound containing three different elements. In one or more embodiments, the ternary material comprises a Ln, one or more metal M, and carbon, oxygen, nitrogen, boron, or silicon.

In one or more embodiments, the lanthanide film formed or deposited comprises a lanthanide nitride film, a lanthanide oxide film, a lanthanide carbide film, a lanthanide silicide film, a lanthanide silicate film, a lanthanide boride film, a lanthanide carbonitride film, a lanthanide oxycarbide film, a lanthanide oxynitride film, a lanthanide boronitride film, a lanthanide metallic film, or combinations thereof.

In one or more embodiments, the ternary material formed or deposited comprises a lanthanide metallic film. The lanthanide metallic film of one or more embodiments comprises lanthanum scandate ($LnScO_3$), lanthanum titanate ($LnTiO_3$), lanthanum lutetium oxide ($LnLuO_3$), lanthanum cobalt oxide ($LnCoO_2$), yttrium scandate ($YScO_3$), yttrium titanate ($YTiO_3$), yttrium lutetium oxide ($YLuO_3$), yttrium cobalt oxide ($YCoO_2$), or combinations thereof. The skilled artisan will recognize that the chemical formulae shown are representative of an idealized film and are not intended to impart stoichiometric limitations on the metallic film composition. For example, a lanthanum scandate film will have lanthanum, scandium and oxygen atoms in approximately a 1:1:3 ratio.

In some embodiments, the lanthanide-containing precursor, the metal M, and the reactant are exposed to the substrate surface sequentially. In other embodiments, the lanthanide-containing precursor, the metal M, and the reactant are exposed to the substrate surface simultaneously.

In some embodiments, a two reactant (AB) process has a pulse sequence including lanthanide-containing precursor exposure, purge, reactant exposure, purge to deposit the lanthanide-containing film. In a time-domain ALD process, the lanthanide-containing precursor can be pulsed to the processing chamber followed by purging out the excess reactant/by-products. The lanthanide-containing precursor adsorbs onto the substrate (or reacts with the substrate surface) to leave a lanthanide-containing species. The surface is exposed to a reactant (e.g., $NH_3$ or $N_2$) which reacts with surface chemisorbed lanthanide-containing-precursor. The reaction can be a thermal process (i.e., without plasma) or a plasma-enhanced process. Excess reactant, reaction products and/or by-products are purged from the processing chamber. In a spatial ALD process, the lanthanide-containing precursor and reactant are provided to different parts of the processing chamber. The process regions are separated by gas curtains which may include purge gases and vacuum streams. The pulse sequence can be repeated to grow a film of a predetermined thickness.

Some embodiments provide a three reactant (ABC) process to form a lanthanide containing film. PEALD of lanthanide containing film can be achieved by using the pulse sequence lanthanide-containing precursor, purge, reactant, purge, treatment plasma, purge. Those skilled in the art will understand that the pulse sequence can be used in a time-domain process or a spatial process. The lanthanide-containing precursor can be pulsed into the chamber followed by purging out the excess reactant/by-products, or moving the substrate out of the lanthanide-containing process region of a spatial ALD chamber. The substrate can be exposed to a reactant (e.g., $NH_3$) in a thermal process to react with the lanthanide-containing species. Excess reactant can be purged from the process chamber or the substrate can be moved from the reactant process region of the process chamber. The reactive sites on the substrate can be regenerated by using a treatment plasma exposure. The pulse sequence can be repeated to grow a film of a predetermined thickness.

In one or more embodiments, a method of depositing a film comprises positioning a substrate in a processing chamber; exposing at least a portion of a substrate surface to a lanthanide-containing precursor comprising a metal coordination complex of formula I $Ln_xL_y$ (I) wherein Ln is a lanthanide having an oxidation state of +3 and is selected from the group consisting of Y, Sc, La, Ce, Pr, Nd, Pm, Sm, Eu, Gd, Tb, Dy, Ho, Er, Tm, Yb, and Lu, x is 1 or 2, y is an integer from 1 to 4, L is selected from NR'CH$_2$CRRO, NR'NCRO, or NR=CHCH=NR, and R, R' are independently selected from hydrogen, branched or unbranched $C_{1-12}$ alkyl, substituted or unsubstituted $C_{1-12}$ aryl, branched or unbranched $C_{1-6}$ alkenyl, branched or unbranched $C_{1-6}$ alkynyl, acyl, alkyamido, hydrazido, silyl, aldehyde, or keto groups; purging the processing chamber of the lanthanide-containing precursor; exposing at least a portion of the substrate surface to a reactant; and purging the processing chamber of the reactant to deposit a lanthanide-containing film on the substrate surface.

In one or more embodiments, a nitrogen reactant is used. The nitrogen reactant can be any suitable nitrogen species that can react with the lanthanide-containing species on the substrate. In some embodiments, the nitrogen reactant comprises one or more of nitrogen, NO, $NO_2$, $N_2O$, ammonia, hydrazine or hydrazine derivatives. In some embodiments, the nitrogen reactant consists essentially of ammonia. As used in this regard, the term "consists essentially of ammonia" means that the reactive species in the nitrogen reactant is greater than or equal to about 95%, 98% or 99% of the stated species. In some embodiments, the nitrogen reactant is co-flowed with an inert, diluent or carrier gas. Suitable inert, diluent or carrier gases include, but are not limited to, argon, hydrogen, helium and nitrogen. In some embodiments, the nitrogen reactant comprises, or consists essentially of, ammonia and the nitrogen reactant is mixed with one or more of $N_2$, Ar, $H_2$ or He.

In some embodiments, the nitrogen reactant comprises a reactant plasma. The reactant plasma of some embodiments comprises a plasma one or more of nitrogen, ammonia, hydrazine or hydrazine derivatives. The reactant plasma may also include diluent or carrier gases, including but not limited to nitrogen, argon, hydrogen, or helium and plasmas thereof. The reactant plasma can be a direct plasma or remote plasma. The reactant plasma can be a conductively coupled plasma (CCP) or inductively coupled plasma (ICP).

The treatment plasma, as used herein, is a plasma exposure that is separate from the nitrogen reactant. The deposition process can be thermal or plasma enhanced and the addition of a treatment plasma can be used with either. In some embodiments, the treatment plasma comprises one or more of plasma activated Ar, $N_2$, $H_2$, He, or combination thereof. The treatment plasma can be a direct plasma or remote plasma. The treatment plasma can be a conductively coupled plasma (CCP) or inductively coupled plasma (ICP).

In some embodiments, the method includes exposing the lanthanide-containing film, on the substrate to a treatment plasma to change a property of the film. In some embodiments, the treatment plasma comprises one or more of nitrogen, argon, hydrogen or helium. Film properties which can be modified by the treatment plasma include, but are not limited to, density, wet etch rate and refractive index.

One or more embodiments of the disclosure are directed to a method comprising sequentially exposing a substrate to a lanthanide-containing precursor and a first reactant to form a lanthanide-containing film, and sequentially exposing the substrate to a one or metal M selected from Sc, Ti, Lu, Co, Y, La, Al, I, Ac, Zr, Hf, V, Nb, Ta, Cr, Mo, W, Mn, Re, Tc, Fe, Ru, Os, Rh, Ir, Ni, Pd, Pt, Cu, Ag, Au, Zn, Cd, or Sn, and a second reactant to form a ternary lanthanide metallic film. The first and second reactants can be the same or different. The concentrations, plasma states (i.e., no plasma or plasma) or chemical composition of the first reactant is independent of the second reactant. In some embodiments, the first reactant and the second reactant are the same species. In some embodiments, the first reactant and the second reactant are the same.

In some embodiments, the method also includes repeating the formation of the lanthanide-containing film to form a lanthanide-containing film of a predetermined thickness. The predetermined thickness of the lanthanide-containing film can vary depending on the use of the film. For example, a lanthanide-containing thin film may have a different thickness than a lanthanide-containing etch contrast film which may have a different thickness than a lanthanide containing copper barrier layer. In some embodiments, the lanthanide-containing film has a thickness in the range of about 1 Å to about 100 Å, or in the range of about 5 Å to about 50 Å. In some embodiments, the lanthanide-containing film has a thickness in the range of about 10 Å to about 1,000 Å, or in the range of about 100 Å to about 800 Å, or in the range of about 200 Å to about 600 Å, or in the range of about 300 Å to about 500 Å.

In some embodiments, the lanthanide-containing precursor, optionally the metal M, and the reactant(s) are provided to the process chamber. The precursors and reactants can be provided as pure compounds, or may be diluted by a diluent or carrier gas. The reactive compound (including any diluent or carrier gas) supplied to the chamber is referred to as a process gas.

Described below is an embodiment of a method of the disclosure wherein a deposited film is formed on the surface of a substrate using an atomic layer deposition (ALD) process. The method described below is exemplary and should not be construed as limiting. The methods of the disclosure may contain additional process steps to those described below.

Each process gas may be supplied under different parameters than other process gasses. A process gas may be provided in one or more pulses or continuously. The flow rate of a process gases can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. A process gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to a process gas may be any suitable amount of time necessary to allow the formation of an adequate nucleation layer or reaction atop the substrate surface. For example, a process gas may be flowed into the process chamber for a period of about 0.1 seconds to about 90 seconds. In some time-domain ALD processes, a process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as a process gas. The inert gas may be mixed with a process gas (e.g., as a diluent gas) or separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, combinations thereof, or the like.

The temperature of the substrate during deposition can be controlled, for example, by setting the temperature of the substrate support or susceptor. In some embodiments the substrate is held at a temperature in the range of about 100° C. to about 600° C., or in the range of about 200° C. to about 525° C., or in the range of about 300° C. to about 475° C., or in the range of about 350° C. to about 450° C. In one or more embodiments, the substrate is maintained at a temperature less than about 475° C., or less than about 450° C., or less than about 425° C., or less than about 400° C., or less than about 375° C.

In addition to the foregoing, additional process parameters may be regulated while exposing the substrate to a process gas. For example, in some embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr.

After exposing the substrate to one process gas, the process chamber (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of greater than 0 to about 10000 sccm to purge the process chamber. In spatial ALD, purge gas curtains are maintained between the flows of reactive gases and purging the process chamber may not be necessary. In some embodiments of a spatial ALD process, the process chamber or region of the process chamber may be purged with an inert gas.

The flow of inert gas may facilitate removing any excess process gases and/or excess reaction byproducts from the process chamber to prevent unwanted gas phase reactions. For example, the flow of inert gas may remove excess process gas from the process chamber, preventing a reaction between the lanthanide precursor and a subsequent process gas.

Then the substrate is exposed to a second process gas for a second period of time. The second process gas may reacts with the species on the substrate surface to create a deposited film. The second process gas may be supplied to the substrate surface at a flow rate greater than the first process gas. In one or more embodiments, the flow rate is greater than about 1 time that of the first process gas, or about 100 times that of the first process gas, or in the range of about 3000 to 5000 times that of the first process gas. The second process gas can be supplied, in time-domain ALD, for a time in the range of about 1 sec to about 30 sec, or in the range of about 5 sec to about 20 sec, or in the range of about 10 sec to about 15 sec. The second process gas can be supplied at a pressure in the range of about 1 Torr to about 30 Torr, or in the range of about 5 Torr to about 25 Torr, or in the range of about 10 Torr to about 20 Torr, or up to about 50 Torr. The substrate temperature can be maintained at any suitable temperature. In one or more embodiments, the substrate is maintained at a temperature less than about 475° C., or at a temperature about the same as that of the substrate during exposure to the first process gas.

The process chamber may again be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of greater than 0 to about 10,000 sccm to purge the process chamber.

While the embodiment of the processing method described above includes only two pulses of reactive gases, it will be understood that this is merely exemplary and that additional pulses of process gases may be used. The pulses can be repeated in their entirety or in part. The cycle can be repeated to form a film of a predetermined thickness.

Referring to the Figures, FIG. 1 shows a processing platform 100 in accordance with one or more embodiment of the disclosure. The embodiment shown in FIG. 1 is merely representative of one possible configuration and should not be taken as limiting the scope of the disclosure. For example, in some embodiments, the processing platform 100 has different numbers of process chambers, buffer chambers and robot configurations.

The processing platform 100 includes a central transfer station 110 which has a plurality of sides 111, 112, 113, 114, 115, 116. The transfer station 110 shown has a first side 111, a second side 112, a third side 113, a fourth side 114, a fifth side 115 and a sixth side 116. Although six sides are shown, those skilled in the art will understand that there can be any suitable number of sides to the transfer station 110 depending on, for example, the overall configuration of the processing platform 100.

The transfer station 110 has a robot 117 positioned therein. The robot 117 can be any suitable robot capable of moving a wafer during processing. In some embodiments, the robot 117 has a first arm 118 and a second arm 119. The first arm 118 and second arm 119 can be moved independently of the other arm. The first arm 118 and second arm 119 can move in the x-y plane and/or along the z-axis. In some embodiments, the robot 117 includes a third arm or a fourth arm (not shown). Each of the arms can move independently of other arms.

A batch processing chamber 120 can be connected to a first side 111 of the central transfer station 110. The batch processing chamber 120 can be configured to process x wafers at a time for a batch time. In some embodiments, the batch processing chamber 120 can be configured to process in the range of about four (x=4) to about 12 (x=12) wafers at the same time. In some embodiments, the batch processing chamber 120 is configured to process six (x=6) wafers at the same time. As will be understood by the skilled artisan, while the batch processing chamber 120 can process multiple wafers between loading/unloading of an individual wafer, each wafer may be subjected to different process conditions at any given time. For example, a spatial atomic layer deposition chamber, like that shown in FIGS. 2 through 6, expose the wafers to different process conditions in different processing regions so that as a wafer is moved through each of the regions, the process is completed.

Figure 2:
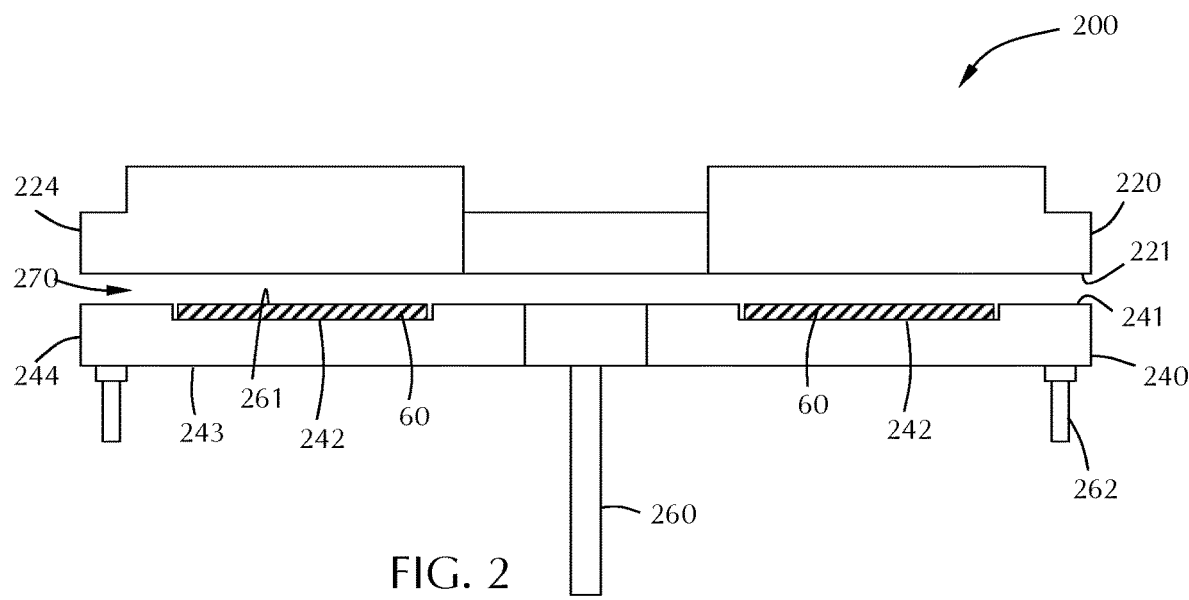
FIG. 2 shows a cross-sectional view of a batch processing chamber in accordance with one or more embodiment of the disclosure.

FIG. 2 shows a cross-section of a processing chamber 200 including a gas distribution assembly 220, also referred to as injectors or an injector assembly, and a susceptor assembly 240. The gas distribution assembly 220 is any type of gas delivery device used in a processing chamber. The gas distribution assembly 220 includes a front surface 221 which faces the susceptor assembly 240. The front surface 221 can have any number or variety of openings to deliver a flow of gases toward the susceptor assembly 240. The gas distribution assembly 220 also includes an outer edge 224 which in the embodiments shown, is substantially round.

The specific type of gas distribution assembly 220 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 3:
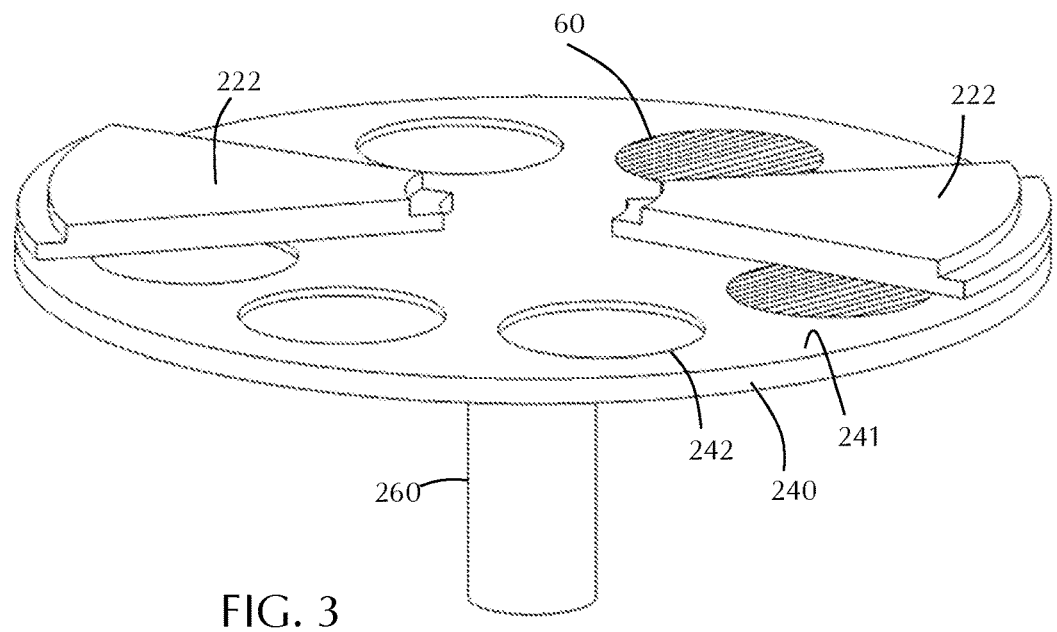
FIG. 3 shows a partial perspective view of a batch processing chamber in accordance with one or more embodiment of the disclosure.

In some embodiments, the gas distribution assembly 220 is a rigid stationary body made of a single injector unit. In one or more embodiments, the gas distribution assembly 220 is made up of a plurality of individual sectors (e.g., injector units 222), as shown in FIG. 3. Either a single piece body or a multi-sector body can be used with the various embodiments of the disclosure described.

A susceptor assembly 240 is positioned beneath the gas distribution assembly 220. The susceptor assembly 240 includes a top surface 241 and at least one recess 242 in the top surface 241. The susceptor assembly 240 also has a bottom surface 243 and an edge 244. The recess 242 can be any suitable shape and size depending on the shape and size of the substrates 60 being processed. In the embodiment shown in FIG. 2, the recess 242 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 2, the recess 242 in the top surface 241 of the susceptor assembly 240 is sized so that a substrate 60 supported in the recess 242 has a top surface 61 substantially coplanar with the top surface 241 of the susceptor 240. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 240 of FIG. 2 includes a support post 260 which is capable of lifting, lowering and rotating the susceptor assembly 240. The susceptor assembly may include a heater, or gas lines, or electrical components within the center of the support post 260. The support post 260 may be the primary means of increasing or decreasing the gap between the susceptor assembly 240 and the gas distribution assembly 220, moving the susceptor assembly 240 into proper position. The susceptor assembly 240 may also include fine tuning actuators 262 which can make micro-adjustments to susceptor assembly 240 to create a predetermined gap 270 between the susceptor assembly 240 and the gas distribution assembly 220.

In some embodiments, the gap 270 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 200 shown in the Figures is a carousel-type chamber in which the susceptor assembly 240 can hold a plurality of substrates 60. As shown in FIG. 3, the gas distribution assembly 220 may include a plurality of separate injector units 222, each injector unit 222 being capable of depositing a film on the wafer, as the wafer is moved beneath the injector unit. Two pie-shaped injector units 222 are shown positioned on approximately opposite sides of and above the susceptor assembly 240. This number of injector units 222 is shown for illustrative purposes only. It will be understood that more or less injector units 222 can be included. In some embodiments, there are a sufficient number of pie-shaped injector units 222 to form a shape conforming to the shape of the susceptor assembly 240. In some embodiments, each of the individual pie-shaped injector units 222 may be independently moved, removed and/or replaced without affecting any of the other injector units 222. For example, one segment may be raised to permit a robot to access the region between the susceptor assembly 240 and gas distribution assembly 220 to load/unload substrates 60.

Figure 4:
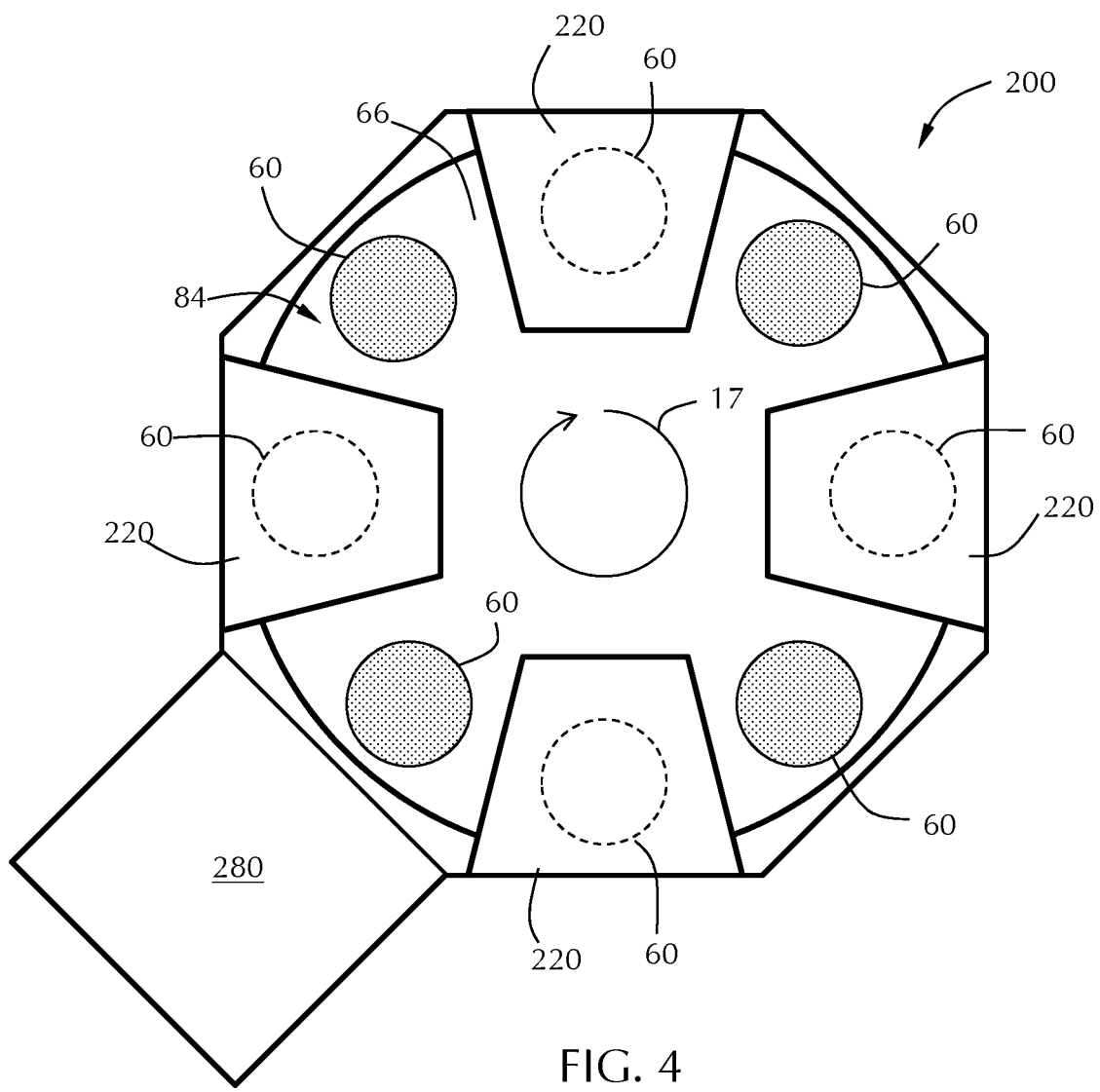
FIG. 4 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 4, the processing chamber 200 has four gas injector assemblies and four substrates 60. At the outset of processing, the substrates 60 can be positioned between the gas distribution assemblies 220. Rotating 17 the susceptor assembly 240 by 45° will result in each substrate 60 which is between gas distribution assemblies 220 to be moved to a gas distribution assembly 220 for film deposition, as illustrated by the dotted circle under the gas distribution assemblies 220. An additional 45° rotation would move the substrates 60 away from the gas distribution assemblies 220. The number of substrates 60 and gas distribution assemblies 220 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4×wafers being processed, where x is an integer value greater than or equal to one. In an exemplary embodiment, the gas distribution assembly 220 includes eight process regions separated by gas curtains and the susceptor assembly 240 can hold six wafers.

The processing chamber 200 shown in FIG. 4 is merely representative of one possible configuration and should not be taken as limiting the scope of the disclosure. Here, the processing chamber 200 includes a plurality of gas distribution assemblies 220. In the embodiment shown, there are four gas distribution assemblies 220 (also called injector assemblies) evenly spaced about the processing chamber 200. The processing chamber 200 shown is octagonal; however, those skilled in the art will understand that this is one possible shape and should not be taken as limiting the scope of the disclosure. The gas distribution assemblies 220 shown are trapezoidal, but can be a single circular component or made up of a plurality of pie-shaped segments, like that shown in FIG. 3.

The embodiment shown in FIG. 4 includes a load lock chamber 280, or an auxiliary chamber like a buffer station.

This chamber 280 is connected to a side of the processing chamber 200 to allow, for example the substrates (also referred to as substrates 60) to be loaded/unloaded from the chamber 200. A wafer robot may be positioned in the chamber 280 to move the substrate onto the susceptor.

Rotation of the carousel (e.g., the susceptor assembly 240) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 5:
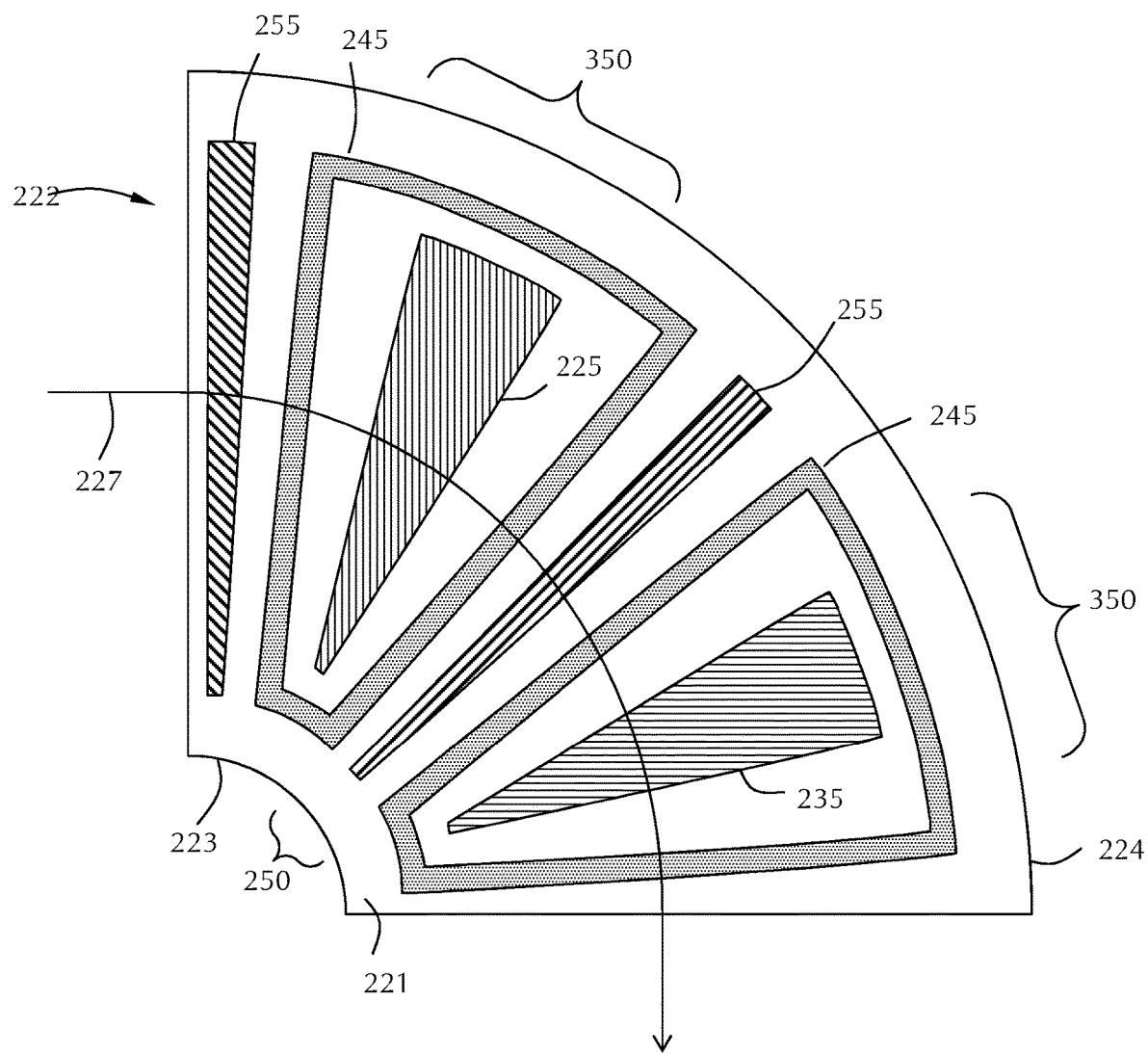
FIG. 5 shows a schematic view of a portion of a wedge shaped gas distribution assembly for use in a batch processing chamber in accordance with one or more embodiment of the disclosure.
Figure 6:
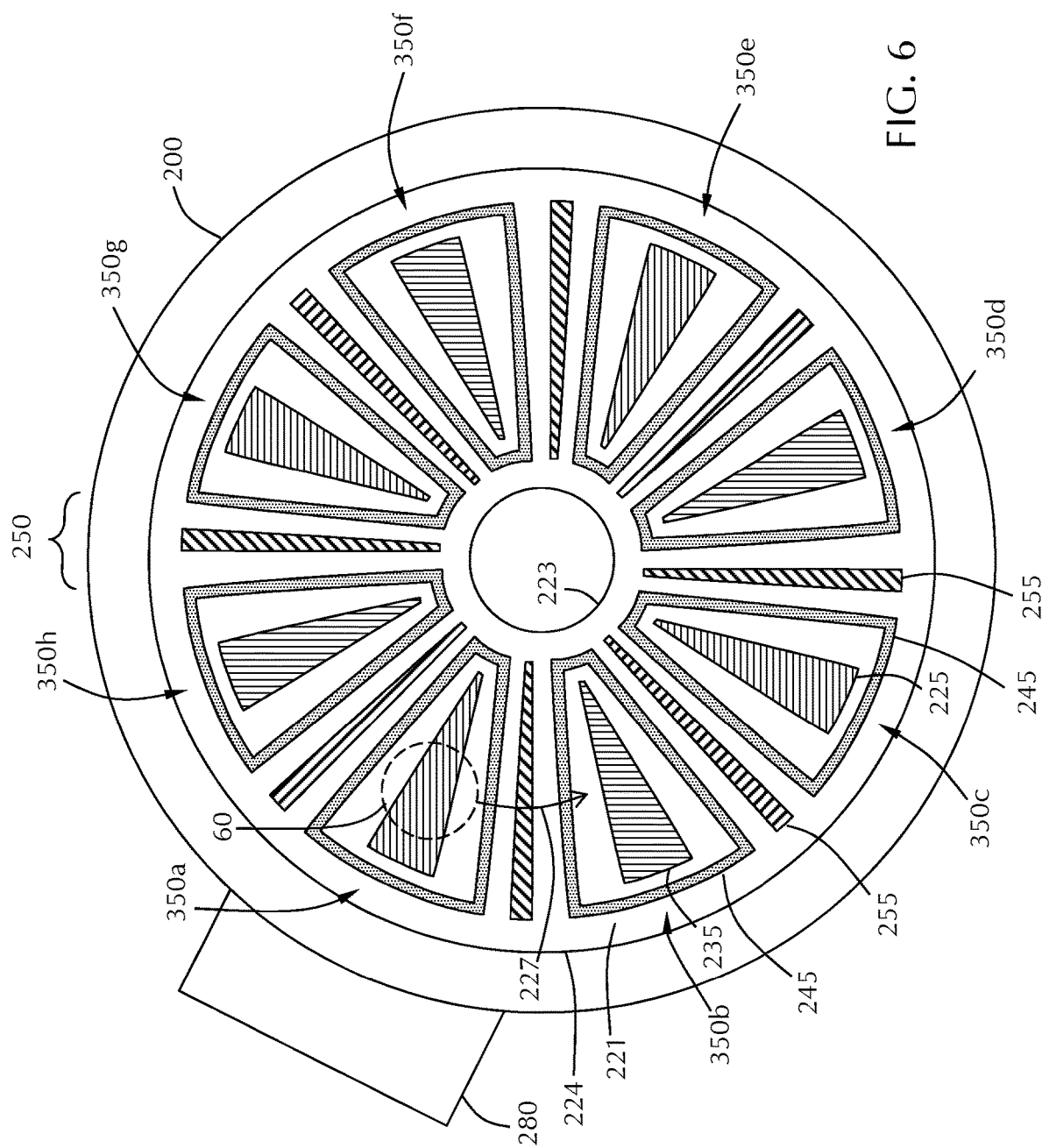
FIG. 6 shows a schematic view of a batch processing chamber in accordance with one or more embodiment of the disclosure.

FIG. 5 shows a sector or portion of a gas distribution assembly 222, which may be referred to as an injector unit. The injector units 222 can be used individually or in combination with other injector units. For example, as shown in FIG. 6, four of the injector units 222 of FIG. 5 are combined to form a single gas distribution assembly 220. (The lines separating the four injector units are not shown for clarity.) While the injector unit 222 of FIG. 5 has both a first reactive gas port 225 and a second gas port 235 in addition to purge gas ports 255 and vacuum ports 245, an injector unit 222 does not need all of these components.

Referring to both FIGS. 5 and 6, a gas distribution assembly 220 in accordance with one or more embodiment may comprise a plurality of sectors (or injector units 222) with each sector being identical or different. The gas distribution assembly 220 is positioned within the processing chamber and comprises a plurality of elongate gas ports 225, 235, 245 in a front surface 221 of the gas distribution assembly 220. The plurality of elongate gas ports 225, 235, 245, 255 extend from an area adjacent the inner peripheral edge 223 toward an area adjacent the outer peripheral edge 224 of the gas distribution assembly 220. The plurality of gas ports shown include a first reactive gas port 225, a second gas port 235, a vacuum port 245 which surrounds each of the first reactive gas ports and the second reactive gas ports and a purge gas port 255.

With reference to the embodiments shown in FIG. 5 or 6, when stating that the ports extend from at least about an inner peripheral region to at least about an outer peripheral region, however, the ports can extend more than just radially from inner to outer regions. The ports can extend tangentially as vacuum port 245 surrounds reactive gas port 225 and reactive gas port 235. In the embodiment shown in FIGS. 5 and 6, the wedge shaped reactive gas ports 225, 235 are surrounded on all edges, including adjacent the inner peripheral region and outer peripheral region, by a vacuum port 245.

Referring to FIG. 5, as a substrate moves along path 227, each portion of the substrate surface is exposed to the various reactive gases. To follow the path 227, the substrate will be exposed to, or "see", a purge gas port 255, a vacuum port 245, a first reactive gas port 225, a vacuum port 245, a purge gas port 255, a vacuum port 245, a second gas port 235 and a vacuum port 245. Thus, at the end of the path 227 shown in FIG. 5, the substrate has been exposed to the first reactive gas 225 and the second reactive gas 235 to form a layer. The injector unit 222 shown makes a quarter circle but could be larger or smaller. The gas distribution assembly 220 shown in FIG. 6 can be considered a combination of four of the injector units 222 of FIG. 3 connected in series.

The injector unit 222 of FIG. 5 shows a gas curtain 250 that separates the reactive gases. The term "gas curtain" is used to describe any combination of gas flows or vacuum that separate reactive gases from mixing. The gas curtain 250 shown in FIG. 5 comprises the portion of the vacuum port 245 next to the first reactive gas port 225, the purge gas port 255 in the middle and a portion of the vacuum port 245 next to the second gas port 235. This combination of gas flow and vacuum can be used to prevent or minimize gas phase reactions of the first reactive gas and the second reactive gas.

Referring to FIG. 6, the combination of gas flows and vacuum from the gas distribution assembly 220 form a separation into a plurality of process regions 350. The process regions are roughly defined around the individual gas ports 225, 235 with the gas curtain 250 between 350. The embodiment shown in FIG. 6 makes up eight separate process regions 350 with eight separate gas curtains 250 between. A processing chamber can have at least two process regions. In some embodiments, there are at least three, four, five, six, seven, eight, nine, 10, 11 or 12 process regions.

During processing a substrate may be exposed to more than one process region 350 at any given time. However, the portions that are exposed to the different process regions will have a gas curtain separating the two. For example, if the leading edge of a substrate enters a process region including the second gas port 235, a middle portion of the substrate will be under a gas curtain 250 and the trailing edge of the substrate will be in a process region including the first reactive gas port 225.

A factory interface 280 (as shown in FIG. 4), which can be, for example, a load lock chamber, is shown connected to the processing chamber 200. A substrate 60 is shown superimposed over the gas distribution assembly 220 to provide a frame of reference. The substrate 60 may often sit on a susceptor assembly to be held near the front surface 221 of the gas distribution plate 220. The substrate 60 is loaded via the factory interface 280 into the processing chamber 200 onto a substrate support or susceptor assembly (see FIG. 4). The substrate 60 can be shown positioned within a process region because the substrate is located adjacent the first reactive gas port 225 and between two gas curtains 250a, 250b. Rotating the substrate 60 along path 227 will move the substrate counter-clockwise around the processing chamber 200. Thus, the substrate 60 will be exposed to the first process region 350a through the eighth process region 350h, including all process regions between.

Some embodiments of the disclosure are directed to a processing chamber 200 with a plurality of process regions 350a-350h with each process region separated from an adjacent region by a gas curtain 250. For example, the processing chamber shown in FIG. 6. The number of gas curtains and process regions within the processing chamber can be any suitable number depending on the arrangement of gas flows. The embodiment shown in FIG. 6 has eight gas curtains 250 and eight process regions 350a-350h.

Referring back to FIG. 1, the processing platform 100 includes a treatment chamber 140 connected to a second side 112 of the central transfer station 110. The treatment chamber 140 of some embodiments is configured to expose the wafers to a process to treat the wafers before and/or after processing in first batch processing chamber 120. The treatment chamber 140 of some embodiments comprises an annealing chamber. The annealing chamber can be a furnace annealing chamber or a rapid thermal annealing chamber, or a different chamber configured to hold a wafer at a predetermined temperature and pressure and provide a flow of gas to the chamber.

In some embodiments, the processing platform further comprises a second batch processing chamber 130 connected to a third side 113 of the central transfer station 110. The second batch processing chamber 130 can be configured similarly to the batch processing chamber 120, or can be configured to perform a different process or to process different numbers of substrates.

The second batch processing chamber 130 can be the same as the first batch processing chamber 120 or different. In some embodiments, the first batch processing chamber 120 and the second batch processing chamber 130 are configured to perform the same process with the same number of wafers in the same batch time so that x (the number of wafers in the first batch processing chamber 120) and y (the number of wafers in the second batch processing chamber 130) are the same and the first batch time and second batch time (of the second batch processing chamber 130) are the same. In some embodiments, the first batch processing chamber 120 and the second batch processing chamber 130 are configured to have one or more of different numbers of wafers (x not equal to y), different batch times, or both.

In the embodiment shown in FIG. 1, the processing platform 100 includes a second treatment chamber 150 connected to a fourth side 114 of the central transfer station 110. The second treatment chamber 150 can be the same as the treatment chamber 140 or different.

The processing platform 100 can include a controller 195 connected to the robot 117 (the connection is not shown). The controller 195 can be configured to move wafers between the pre-clean chamber 140 and the first batch processing chamber 120 with a first arm 118 of the robot 117. In some embodiments, the controller 195 is also configured to move wafers between the second single wafer processing chamber 150 and the second batch processing chamber 130 with a second arm 119 of the robot 117.

In some embodiments, the controller 195 is connected to the susceptor assembly 240 and the gas distribution assembly 220 of a processing chamber 200. The controller 195 can be configured to rotate 17 the susceptor assembly 240 about a central axis. The controller can also be configured to control the gas flows in the gas ports 225, 235, 245, 255. In some embodiments, the first reactive gas port 225 provides a flow of a yttrium precursor. In some embodiments, the second reactive gas port 235 provides a flow of a silicon precursor. In some embodiments, other gas ports (not labelled) may provide a flow of nitrogen reactant or a treatment plasma. The first reactive gas port 225, the second reactive gas port 235 and the other reactive gas ports (not labelled) may be arranged in any processing order.

The processing platform 100 can also include a first buffer station 151 connected to a fifth side 115 of the central transfer station 110 and/or a second buffer station 152 connected to a sixth side 116 of the central transfer station 110. The first buffer station 151 and second buffer station 152 can perform the same or different functions. For example, the buffer stations may hold a cassette of wafers which are processed and returned to the original cassette, or the first buffer station 151 may hold unprocessed wafers which are moved to the second buffer station 152 after processing. In some embodiments, one or more of the buffer stations are configured to pre-treat, pre-heat or clean the wafers before and/or after processing.

In some embodiments, the controller 195 is configured to move wafers between the first buffer station 151 and one or more of the treatment chamber 140 and the first batch processing chamber 120 using the first arm 118 of the robot 117. In some embodiments, the controller 195 is configured to move wafers between the second buffer station 152 and one or more of the second treatment chamber 150 or the second batch processing chamber 130 using the second arm 119 of the robot 117.

The processing platform 100 may also include one or more slit valves 160 between the central transfer station 110 and any of the processing chambers. In the embodiment shown, there is a slit valve 160 between each of the processing chambers 120, 130, 140, 150 and the central transfer station 110. The slit valves 160 can open and close to isolate the environment within the processing chamber from the environment within the central transfer station 110. For example, if the processing chamber will generate plasma during processing, it may be helpful to close the slit valve for that processing chamber to prevent stray plasma from damaging the robot in the transfer station.

In some embodiments, the processing chambers are not readily removable from the central transfer station 110. To allow maintenance to be performed on any of the processing chambers, each of the processing chambers may further include a plurality of access doors 170 on sides of the processing chambers. The access doors 170 allow manual access to the processing chamber without removing the processing chamber from the central transfer station 110. In the embodiment shown, each side of each of the processing chamber, except the side connected to the transfer station, have an access door 170. The inclusion of so many access doors 170 can complicate the construction of the processing chambers employed because the hardware within the chambers would need to be configured to be accessible through the doors.

The processing platform of some embodiments includes a water box 180 connected to the transfer chamber 110. The water box 180 can be configured to provide a coolant to any or all of the processing chambers. Although referred to as a "water" box, those skilled in the art will understand that any coolant can be used.

In some embodiments, the size of the processing platform 100 allows for the connection to house power through a single power connector 190. The single power connector 190 attaches to the processing platform 100 to provide power to each of the processing chambers and the central transfer station 110.

The processing platform 100 can be connected to a factory interface 102 to allow wafers or cassettes of wafers to be loaded into the platform 100. A robot 103 within the factory interface 102 can be moved the wafers or cassettes into and out of the buffer stations 151, 152. The wafers or cassettes can be moved within the platform 100 by the robot 117 in the central transfer station 110. In some embodiments, the factory interface 102 is a transfer station of another cluster tool.

In some embodiments, the processing platform 100 or batch processing chamber 120 is connected to a controller. The controller can be the same controller 195 or a different controller. The controller can be coupled to the susceptor assembly and the gas distribution assembly of the batch processing chamber 120 and has one or more configurations. The configurations can include, but are not limited to, a first configuration to rotate the susceptor assembly about the central axis, a second configuration to provide a flow of a lanthanide-containing precursor to a process region, the lanthanide-containing precursor comprising a lanthanide-containing species with a general formula $Ln_xL_y$, wherein Ln is a lanthanide having an oxidation state of +3, x is 1 or 2, y is an integer from 1 to 4, L is selected from $NR'CH_2CR_2O$, $NR'N=CRO$, or $NR=CHCH=NR$ and R, R' are independently selected from hydrogen, branched or unbranched $C_{1-12}$ alkyl, substituted or unsubstituted $C_{1-12}$ aryl, branched or unbranched $C_{1-6}$ alkenyl, branched or unbranched $C_{1-6}$ alkynyl, acyl, alkyamido, hydrazido, silyl, aldehyde, or keto groups; a third configuration to provide a flow of one or more metal M selected from Sc, Ti, Lu, Co, Y, La, Al, I, Ac, Zr, Hf, V, Nb, Ta, Cr, Mo, W, Mn, Re, Tc, Fe, Ru, Os, Rh, Ir, Ni, Pd, Pt, Cu, Ag, Au, Zn, Cd, or Sn to a process region; a fourth configuration to provide a flow of a reactant to one or more of the process regions, the nitrogen reactant comprising one or more of one or more of $O_2$, $O_3$, $H_2O_2$, water, $NH_3$, hydrazine, hydrazine derivatives, $NO_2$, $N_2O$, silane, disilane, alkene, alkyne, boron, combinations thereof, or plasmas thereof; or a fifth configuration to provide a treatment plasma in a process region.

EXAMPLES

Example 1—Aminoalkoxide Ligand Synthesis

A solution of 2-methyl-1-propenoxide dissolved in THF is slowly added to a stirred and pre-cooled solution of $LiNMe_2$ in THF. This mixture is stirred overnight at room temperature then quenched with a stoichometric amount of water. The resultant THF layer is dried over $MgSO_4$ and the product is obtained by fractional distillation.

Example 2—Lanthanide-Containing Aminoalkoxide Precursor Synthesis

To a cooled THF solution of the desired aminoalkoxide, an equivalent amount of MeLi is added. This solution is then added dropwise by cannula over a 30 min period to a stirred suspension of any anhydrous lanthanide(III) chloride. The resultant solution is to be stirred for 6 hours at ambient temperature. Solvent can then be removed in vacuo with the resultant residue subjected to further purification (solid-sublimation, liquid-distillation).

Example 3—Thin Film Deposition

In a thin film deposition reactor with substrate temperatures are held between 25 and 500° C., the selected lanthanide-containing precursor (held between 0-250° C.) is delivered to a substrate via vapor phase delivery for a pre-determined pulse length (0.1-60s). During this process, the deposition reactor is operated under a flow of inert carrier gas with the chamber held at a pre-determined temperature (0-500° C.) and pressure (selected between 1 mTorr-760 Torr). After the pulse of the selected lanthanide-containing precursor, the chamber is then subsequently pumped and purged of all requisite gases and byproducts for a determined amount of time. Subsequently, a co-reactant is pulsed into the chamber for a predetermined pulse length (0.1-60s) and chamber pressure (1 mTorr-760 Torr). An additional chamber purge is then performed to rid the reactor of any excess reactants and reaction byproducts. This process is repeated as many times as necessary to get the target film to the desired film thickness.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
    exposing a substrate to a lanthanide-containing precursor to form a lanthanide species on the substrate, wherein the lanthanide-containing precursor comprises a metal coordination complex of formula (I)

$$Ln_xL_y \qquad (I)$$

wherein
    Ln is a lanthanide having an oxidation state of +3 and is selected from the group consisting of Y, Sc, La, Ce, Pr, Nd, Pm, Sm, Eu, Gd, Tb, Dy, Ho, Er, Tm, Yb, and Lu,
    x is 2,
    y is an integer from 2 to 4,
    L is selected from $NR'CH_2CRRO$, NR'NCRO, or $NR=CHCH=NR$, and
    R, R' are independently selected from the group consisting of hydrogen, branched $C_{1-12}$ alkyl, unbranched $C_{1-12}$ alkyl, substituted $C_{1-12}$ aryl, unsubstituted $C_{1-12}$ aryl, branched $C_{1-6}$ alkenyl, unbranched $C_{1-6}$ alkenyl, branched $C_{1-6}$ alkynyl, unbranched $C_{1-6}$ alkynyl, acyl, alkyamido, hydrazido, silyl, aldehyde, and keto groups, and the metal coordination complex is a dimer; and
    exposing the substrate to a reactant to react with the lanthanide species on the substrate to form a lanthanide film.

2. The method of claim 1, wherein the metal coordination complex is homoleptic.

3. The method of claim 1, wherein Ln is selected from the group consisting of Y, Sc, and La.

4. The method of claim 1, further comprising exposing the substrate to a metal-containing precursor to form a ternary material comprising Ln and one or more metal M comprising Sc, Ti, Lu, Co, Y, La, Al, I, Ac, Zr, Hf, V, Nb, Ta, Cr, Mo, W, Mn, Re, Tc, Fe, Ru, Os, Rh, Ir, Ni, Pd, Pt, Cu, Ag, Au, Zn, Cd, or Sn.

5. The method of claim 1, wherein the lanthanide-containing precursor and the reactant are exposed to the substrate sequentially.

6. The method of claim 1, wherein the lanthanide-containing precursor and the reactant are exposed to the substrate simultaneously.

7. The method of claim 1, wherein the reactant comprises one or more of $O_2$, $O_3$, $H_2O_2$, water, $NH_3$, hydrazine, hydrazine derivatives, $NO_2$, $N_2O$, silane, disilane, alkene, alkyne, boron, combinations thereof, or plasmas thereof.

8. The method of claim 7, wherein the lanthanide film comprises a lanthanide nitride film, a lanthanide oxide film, a lanthanide carbide film, a lanthanide silicide film, a lanthanide silicate film, a lanthanide boride film, a lanthanide carbonitride film, a lanthanide oxycarbide film, a lanthanide oxynitride film, a lanthanide boronitride film, a lanthanide metallic film, or combinations thereof.

9. A method of depositing a film, the method comprising:
   positioning a substrate in a processing chamber;
   exposing at least a portion of a substrate surface to a lanthanide-containing precursor comprising a metal coordination complex of formula (I)

$$Ln_xL_y \qquad (I)$$ 

wherein
   Ln is a lanthanide having an oxidation state of +3 and is selected from the group consisting of Y, Sc, La, Ce, Pr, Nd, Pm, Sm, Eu, Gd, Tb, Dy, Ho, Er, Tm, Yb, and Lu,
   x is 2,
   y is an integer from 2 to 4,
   L is selected from NR'CH$_2$CRRO, NR'NCRO, or NR=CHCH=NR, and
   R, R' are independently selected from the group consisting of hydrogen, branched $C_{1-12}$ alkyl, unbranched $C_{1-12}$ alkyl, substituted $C_{1-12}$ aryl, unsubstituted $C_{1-12}$ aryl, branched $C_{1-6}$ alkenyl, unbranched $C_{1-6}$ alkenyl, branched $C_{1-6}$ alkynyl, unbranched $C_{1-6}$ alkynyl, acyl, alkyamido, hydrazido, silyl, aldehyde, and keto groups, and the metal coordination complex is a dimer;
   purging the processing chamber of the lanthanide-containing precursor;
   exposing at least a portion of the substrate surface to a reactant; and
   purging the processing chamber of the reactant to deposit a lanthanide-containing film on the substrate surface.

10. The method of claim 9, further comprising exposing at least a portion of the substrate surface to a metal-containing precursor to form a ternary material comprising Ln and one or more metal comprising Sc, Ti, Lu, Co, Y, La, Al, I, Ac, Zr, Hf, V, Nb, Ta, Cr, Mo, W, Mn, Re, Tc, Fe, Ru, Os, Rh, Ir, Ni, Pd, Pt, Cu, Ag, Au, Zn, Cd, or Sn; and purging the processing chamber of the metal-containing precursor.

11. A method of depositing a film, the method comprising:
    exposing a substrate to a lanthanide-containing precursor to form a lanthanide species on the substrate, wherein the lanthanide-containing precursor comprises a metal coordination complex of Formula (II), Formula (III), or Formula (IV):

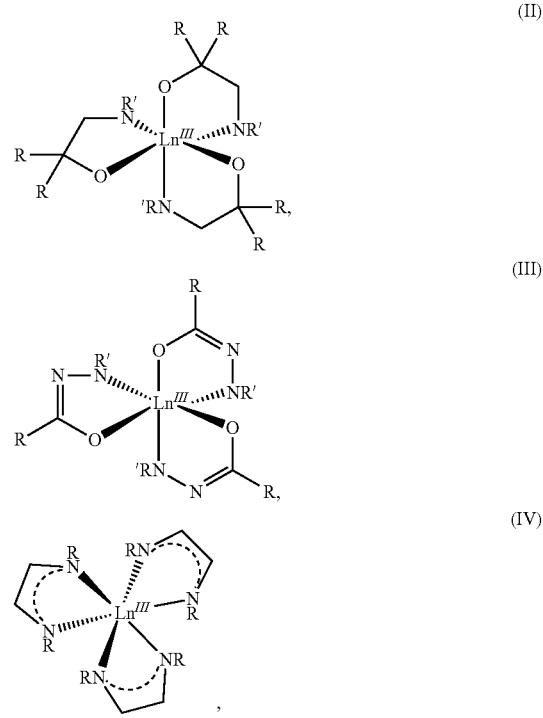

wherein Ln is a lanthanide having an oxidation state of +3 and is selected from the group consisting of Y, Sc, La, Ce, Pr, Nd, Pm, Sm, Eu, Gd, Tb, Dy, Ho, Er, Tm, Yb, and Lu, and R, R' are independently selected from the group consisting of hydrogen, branched $C_{1-12}$ alkyl, unbranched $C_{1-12}$ alkyl, substituted $C_{1-12}$ aryl, unsubstituted $C_{1-12}$ aryl, branched $C_{1-6}$ alkenyl, unbranched $C_{1-6}$ alkenyl, branched $C_{1-6}$ alkynyl, unbranched $C_{1-6}$ alkynyl, acyl, alkyamido, hydrazido, silyl, aldehyde, and keto groups; and
    exposing the substrate to a reactant to react with the lanthanide species on the substrate to form a lanthanide film.

12. The method of claim 11, wherein the metal coordination complex is homoleptic.

13. The method of claim 11, wherein Ln is selected from the group consisting of Y, Sc, and La.

14. The method of claim 11, further comprising exposing at least a portion of the substrate surface to a metal-containing precursor to form a ternary material comprising Ln and one or more metal selected from the group consisting of Sc, Ti, Lu, Co, Y, La, Al, I, Ac, Zr, Hf, V, Nb, Ta, Cr, Mo, W, Mn, Re, Tc, Fe, Ru, Os, Rh, Ir, Ni, Pd, Pt, Cu, Ag, Au, Zn, Cd, or Sn.

15. The method of claim 11, wherein the lanthanide-containing precursor and the reactant are exposed to the substrate sequentially.

16. The method of claim 11, wherein the lanthanide-containing precursor and the reactant are exposed to the substrate simultaneously.

17. The method of claim 11, wherein the reactant comprises one or more of $O_2$, $O_3$, $H_2O_2$, water, $NH_3$, hydrazine, hydrazine derivatives, $NO_2$, $N_2O$, silane, disilane, alkene, alkyne, boron, combinations thereof, or plasmas thereof.

18. The method of claim 17, wherein the lanthanide film comprises a lanthanide nitride film, a lanthanide oxide film, a lanthanide carbide film, a lanthanide silicide film, a lanthanide silicate film, a lanthanide boride film, a lanthanide carbonitride film, a lanthanide oxycarbide film, a lanthanide oxynitride film, a lanthanide boronitride film, a lanthanide metallic film, or combinations thereof.

* * * * *

UNITED STATES PATENT AND TRADEMARK OFFICE
CERTIFICATE OF CORRECTION

PATENT NO. : 11,866,824 B2
APPLICATION NO. : 17/941123
DATED : January 9, 2024
INVENTOR(S) : Thomas Knisley et al.

It is certified that error appears in the above-identified patent and that said Letters Patent is hereby corrected as shown below:

In the Specification

Column 2, Line 12, replace "$C_1$-12" after "branched or unbranched" and before "alkyl" with "$C_{1-12}$".

Signed and Sealed this
Fifth Day of March, 2024

Katherine Kelly Vidal
*Director of the United States Patent and Trademark Office*